United States Patent [19]
Tanaka

[11] Patent Number: 5,173,152
[45] Date of Patent: Dec. 22, 1992

[54] METHOD FOR SELECTIVELY REMOVING AN INSULATING FILM

[75] Inventor: Masato Tanaka, Shiga, Japan

[73] Assignee: Dainippon Screen Mfg. Co., Ltd., Japan

[21] Appl. No.: 591,707

[22] Filed: Oct. 2, 1990

[30] Foreign Application Priority Data

Oct. 2, 1989 [JP] Japan .................................. 1-258174

[51] Int. Cl.$^5$ ............................................. H01L 21/00
[52] U.S. Cl. ..................................... 156/646; 156/662; 156/653; 156/655; 156/657
[58] Field of Search ............... 156/646, 653, 655, 662, 156/657

[56] References Cited

U.S. PATENT DOCUMENTS

| | | | |
|---|---|---|---|
| 4,127,437 | 11/1978 | Bersin et al. | 156/646 |
| 4,264,374 | 4/1981 | Beyer | 134/3 |
| 4,605,479 | 8/1986 | Faith | 156/646 |
| 4,717,447 | 1/1988 | Dieleman et al. | 156/646 |
| 4,749,440 | 6/1988 | Blackwood et al. | 156/646 |

FOREIGN PATENT DOCUMENTS

| | | |
|---|---|---|
| 0396002 | 7/1990 | European Pat. Off. |
| 54-125144 | 9/1979 | Japan |
| 55-003638 | 1/1980 | Japan |
| 57-55734 | 9/1982 | Japan |
| 59-166675 | 9/1984 | Japan |
| 62-502930 | 11/1987 | Japan |
| WO8701508 | 12/1987 | PCT Int'l Appl. |

OTHER PUBLICATIONS

"The Dry Ox Process for Etching Silicon Dioxide"; Bersin et al.; Solid State Technology; 20(4); 78-80; 1977.
"Submicron ULSI Process Technology" (Papers prepared for Ultra LSI Ultraclean Technology Symposium No. 7, published by Realize Company.
8th Symposium on ULSI Ultraclean Technology "Submicron ULSI Process Technology II" (Published by Realize Company.
"8th Symposium on ULSI Technology-Submicron ULSI Ultraclean Process Technology", Japan, pp. 200-201.
"Submicron ULSI Process Technology: Proceeding of Symposium on ULSI Ultraclean Technology", Japan, pp. 172-181.
"Etching of thin SiO$_2$ layers using wet HF gas", P. A. M. Van Der Heide et al., Journal of Vacuum Science and Technology; Part A., May 1989, pp. 1719-1723.
"Anhydrous HF Etching on Native SiO$_2$: Applications to Device Fabrication", R. C. Novac, Solid State Technology, Mar. 1988, pp. 39-41.
"Selective Etching of Native Oxide by Dry Processing Using Ultra Clean Anhydrous Hydrogen Fluoride", N. Miki et al., IEDM 1988 International Electron Devices Meeting, Dec. 11-14, 1988.

*Primary Examiner*—Brian E. Hearn
*Assistant Examiner*—George Goudreau
*Attorney, Agent, or Firm*—Ostrolenk, Faber, Gerb & Soffen

[57] ABSTRACT

A method for selectively removing a desired insulating film from a wafer surface. The method includes the steps of: preparing vapor containing hydrogen fluoride and water; keeping the temperature of the wafer surface higher than the temperature of the vapor by a prescribed temperature difference range; and supplying the vapor to the wafer surface. Due to the difference in responsiveness caused by the temperature difference, only the desired film, for example, the native silicon oxide film formed on a silicon layer surface, is selectively etched and removed by the hydrogen fluoride. It is not necessary to extremely reduce the water content in the reaction system, or to accurately regulate the concentration of the hydrogen fluoride gas.

22 Claims, 8 Drawing Sheets

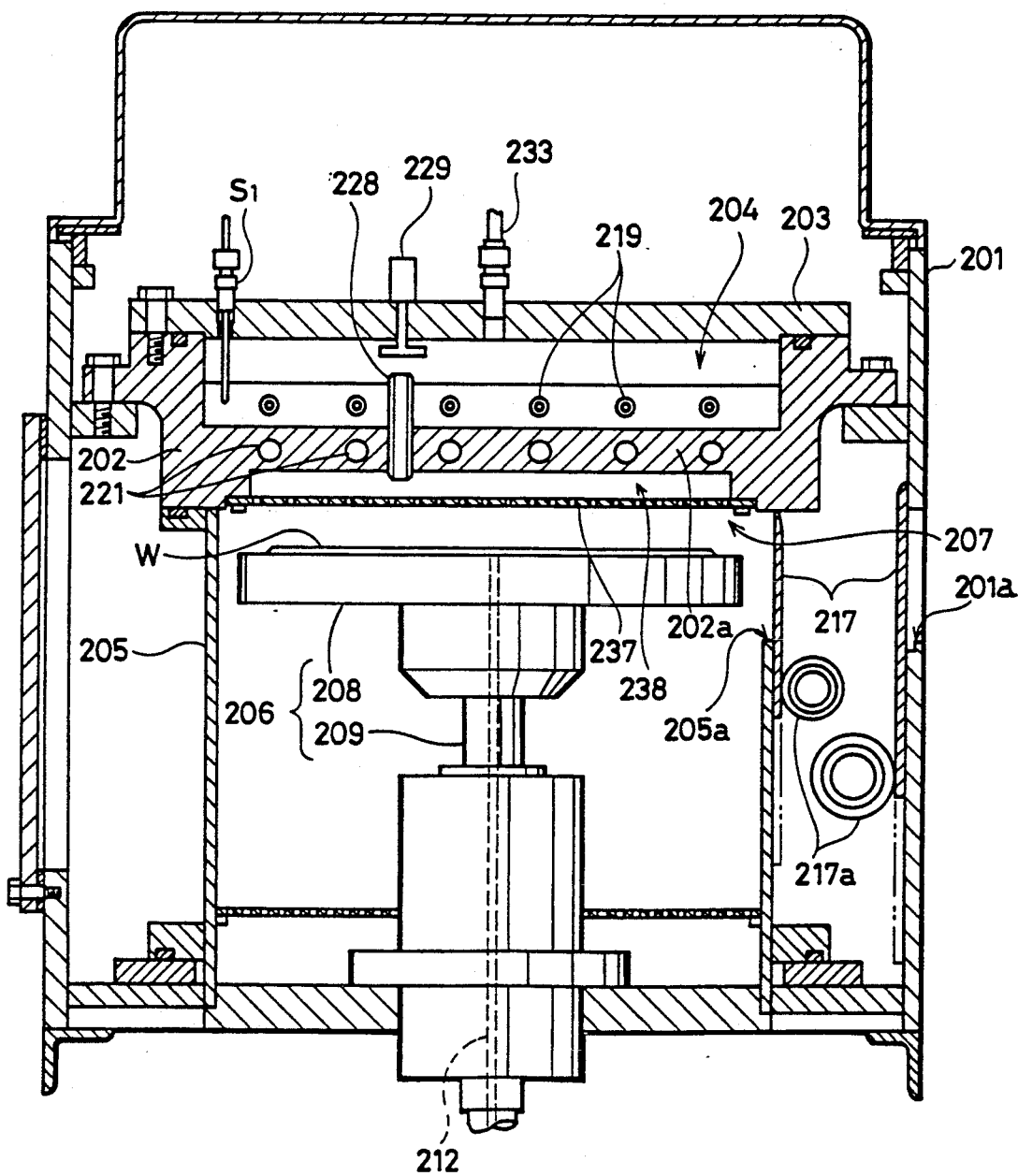

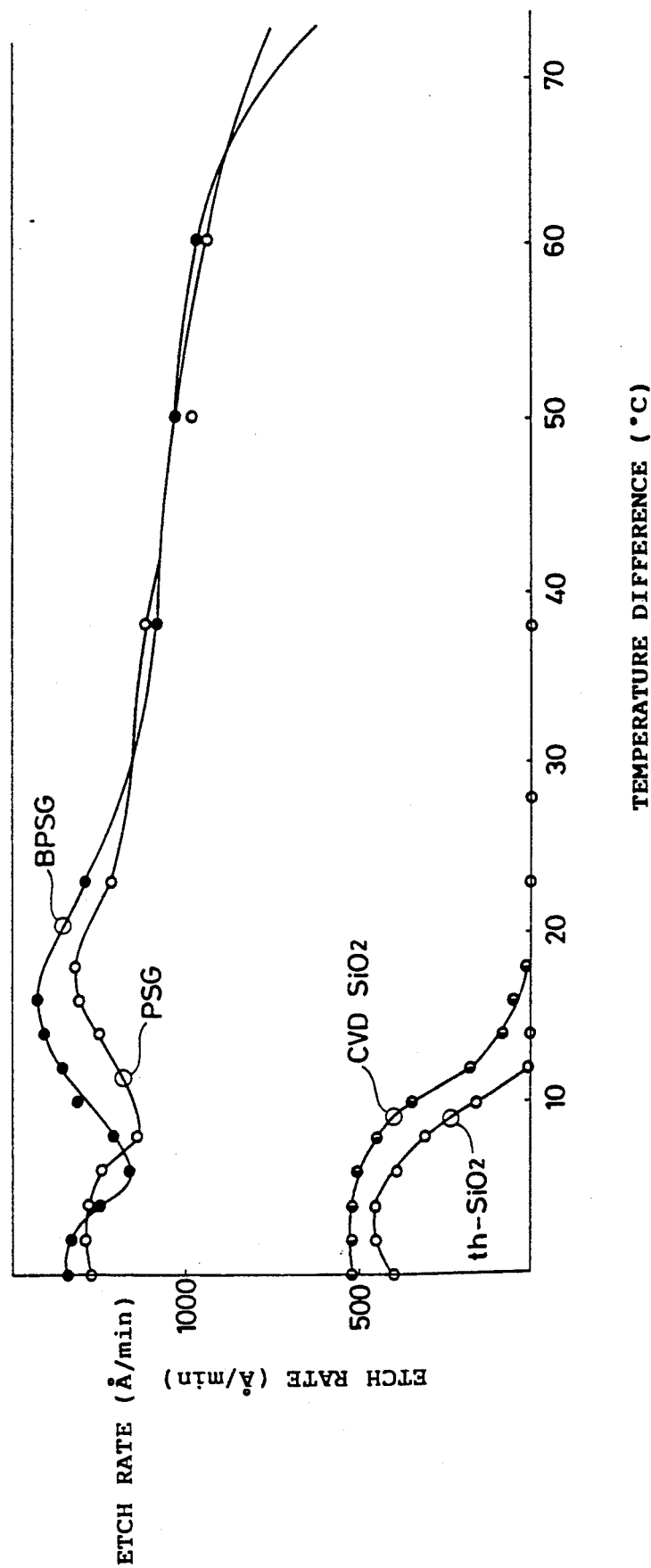

METHOD FOR SELECTIVELY REMOVING AN INSULATING FILM

BACKGROUND OF THE INVENTION

1. Field of the Invention

The present invention relates to methods for removing insulating films such as native silicon oxide films formed on a surface of a silicon wafer, a surface of a polysilicon film, a surface of an amorphous silicon film and the like (hereinafter the "silicon layer "surfaces"). Furthermore the present invention relates to a method for selectively removing insulating films such as thermal silicon dioxide film (th-$SiO_2$), a silicon nitride ($SiN_2$) film a phosphosilicate glass (PSG) film, a borophospho silicate glass (BPSG) film or an arsenosilicate glass (AsSG) film forming a semiconductor device, in addition to the native silicon oxide film.

The above-mentioned PSG film is a binary oxide of $P_2O_2$, and $SiO_2$ and generally is deposited in the $SiH_4 + O_2 + PH_3$ gas system by CVD (Chemical Vapor Deposition) method, while BPSG film is a ternary oxide of $B_2O_3 - P_2O_5 - SiO_2$ and generally is deposited in the $SiH_4 + O_2 + PH_3 + B_2H_6$ gas system by the CVD method.

2. Description of the Related Art

In a process of manufacturing a semiconductor device, contamination sometimes occurs and which adversely affects the operation characteristics of the device. One of the contaminants is a native silicon oxide film formed on a silicon layer surface.

A native oxide film is easily formed to a thickness of 10 to 20 Å on a surface of a silicon layer by merely exposing the same to be atmosphere. A native oxide film is also formed secondarily in a cleaning or an etching step in a semiconductor device manufacturing process.

It is well known that the electric characteristics of, for example, a thin gate oxide film, are considerably affected by the pretreatment of a silicon wafer. Consequently, in order to form a thin oxide film such as a gate oxide film on a silicon wafer in a semiconductor device manufacturing process, it is necessary to remove the native oxide film in advance from the surface of the silicon wafer.

It is also well known that normal electrode function cannot be obtained if the native oxide film remains on the surface of a silicon wafer where electrodes such as a source, a drain and the like are to be formed. In forming a metallic electrode, the native oxide film should be completely removed from a silicon layer surface in order to suppress contact resistance. Also during epitaxial growing of silicon, it is necessary to remove in advance the native oxide film from the silicon layer surface.

Thus, the native silicon oxide film formed on the silicon layer surface must be removed in a semiconductor device manufacturing process, particularly prior to forming a film by chemical vapor deposition (CVD), sputtering or the like.

Methods using hydrogen fluoride (HF) gas have been recently studied for removing native silicon oxide films from silicon layer surfaces. For instance, Japanese National Publication No. 62-502930 of International Patent Application (PCT/US86/01508) proposes the method described below. According to this proposed method, thin hydrogen fluoride gas is supplied together with water vapor ($H_2O$) to a surface of a silicon wafer. The silicon wafer surface is exposed to the gas and vapor. As a result, various silicon oxide films can be removed in an atmosphere of high humidity.

It is to be noted that in manufacturing a semiconductor device, a surface of a silicon wafer is subjected to various film forming steps. Not only a native oxide film but also silicon insulating films such as a silicon oxide film, a silicon nitride film, a PSG film, a BPSG film and an AsSG film are formed by thermal oxidation, CVD and other methods on the silicon wafer. According to the method disclosed in the above-mentioned publication, not only the native oxide film but also the silicon insulating film being formed especially on the wafer are removed from the wafer surface.

On a silicon wafer and also on a semiconductor wafer such as a gallium arsenide (those wafers being generally referred to hereinafter as the "wafers"), there may be formed any film on a polysilicon film or an amorphous silicon film previously formed on the wafer. In this case also, it is necessary to remove in advance the native silicon oxide film on the surface of the polysilicon film or amorphous silicon film.

In view of the above, methods for selectively removing native oxide films have been proposed, for instance, in "Special Issue No. 2 of Nikkei Micro Device" (Nikkei McGraw-Hill, October 1988, pp. 202–207), or in "Submicron ULSI Process Technology" (Papers Prepared for Ultra LSI Ultraclean Technology Symposium No. 7, published by Realize Company, July 1988, pp. 173–193). Those methods utilize the fact that there is a boundary concentration of HF and $H_2O$ components, above which a silicon oxide film is etched and below which no etching occurs, and the fact that there is a difference in boundary concentration between a native silicon oxide film and a thermal silicon oxide film or the like.

According to those methods, the HF gas concentration in nitrogen ($N_2$) gas for dilution is controlled under a condition of a considerably low concentration of $H_2O$ component in the atmosphere. This makes it possible to selectively remove only the native oxide film from the silicon wafer surface.

However, according to the above-described methods, it is necessary to accurately dilute HF gas by $N_2$ gas and to generate diluted HF gas of a concentration of several percentage points by volume. In addition, it is necessary to extremely decrease the levels of $H_2O$ in the atmosphere. Thus, the structure of the entire apparatus becomes complicated and it is not easy to control the apparatus.

SUMMARY OF THE INVENTION

Therefore, an object of the present invention is to selectively remove a desired insulating film by means of a relatively simple and easy process.

Another object of the present invention is to provide a method of selectively removing a first insulating film with respect to a second insulating film without considerably decreasing water in the atmosphere.

A further object of the present invention is to enable selective removal of a desired insulating film by HF gas without requiring accurate dilution of the HF gas.

An additional object of the present invention is to provide a method of selectively removing a desired insulating film by using mixture of HF gas and water vapor without depending on a mixing ratio of HF and $H_2O$.

According to the present invention, a method for selectively removing a first insulating film with respect to a second insulating film, the first and second insulating films being formed on a wafer surface, which method includes the steps of preparing vapor containing hydrogen fluoride and water, relatively keeping a temperature of the vapor higher than the temperature of the wafer surface by a prescribed range, the prescribed range being determined by the first insulating film and the second insulating film, and applying the vapor to the wafer surface, whereby the first insulating film is selectively etched and removed with respect to the second insulating film by the hydrogen fluoride.

By the above-described method, the removal of, for example, the native silicon oxide film proceeds in the following manner. When hydrofluoric acid vapor is supplied to the silicon layer surface, the hydrofluoric acid vapor is adsorbed on the silicon layer surface. The native silicon oxide film formed on the silicon layer surface is etched by a reaction represented by the following chemical formula, in the presence of $H_2O$.

$$SiO_2 + 6HF \rightarrow H_2SiF_6 + 2H_2O$$

By the above-indicated reaction, fluorosilisic acid ($H_2SiF_6$) is formed. $H_2SiF_6$ is present with a high concentration in a liquid film covering the surface of the native silicon oxide film. However, $H_2SiF_6$ is divided into $SiF_4$ and HF gas and soon evaporated ($H_2SiF_6$ gas→$SiF_4 \uparrow + 2HF \uparrow$) and removed from the silicon layer surface.

In the method according to the present invention, the temperature of the silicon layer surface is kept higher than the temperature of the hydrofluoric acid vapor by from 10° C. to 50° C., preferably from 12° C. to 40° C. When the hydrofluoric acid vapor is supplied to the silicon layer surface, adsorption of the hydrofluoric acid vapor onto the silicon layer surface is suppressed.

In this situation, in etching the native oxide film formed on the silicon layer surface, the reaction indicated in the above-mentioned expression is not hindered as much during the process. However, the etching reactions of the other silicon insulating films are almost totally inhibited.

The reasons for those differences in the reactions of the native oxide film and the silicon insulating films are not clear at present. One possible explanation is a difference in the qualities of those films. Another possible explanation is a difference in water contents of the films. A further possible explanation is the influence of water molecules adhering on the oxide film.

Apart from detailed explanation of the mechanism, according to the present invention, only the native silicon oxide film is selectively etched and removed from the silicon layer surface as described above.

According to the invention, it is possible to selectively remove not only the native silicon oxide film with respect to the thermal silicon dioxide, but also a first insulating film such as the PSG film with respect to a second insulating film such as the thermal silicon dioxide film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5 and 6 are schematic vertical sectional views illustrating an apparatus for practicing the present invention.

FIGS. 7A, 7B and 8 are graphs showing the relationship between the etching rates of the insulating films and the temperature differences of the hydrofluoric acid vapor from the wafer surface which is confirmed using the apparatus shown in FIGS. 5 and 6.

DESCRIPTION OF THE PREFERRED EMBODIMENTS

Figure 1:
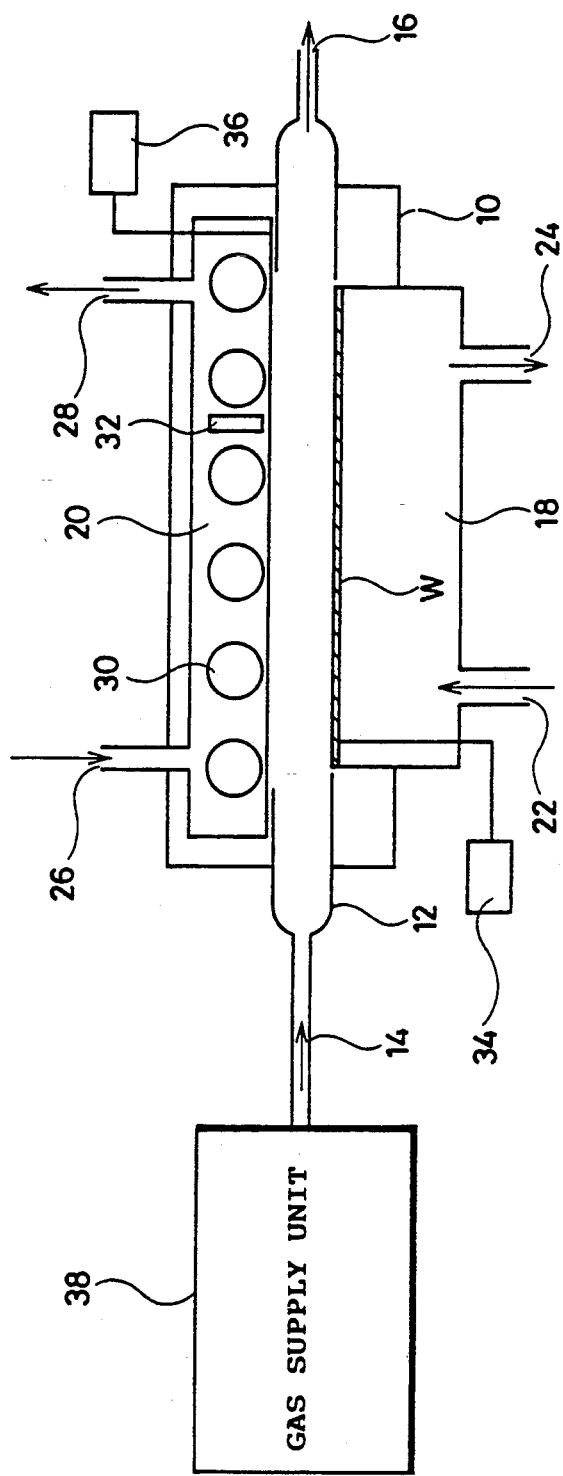
FIG. 1 is a schematic diagram showing an apparatus for applying a method according to an embodiment of the present invention.

Referring to FIG. 1, an apparatus for applying a method of removing a native silicon oxide film on a silicon layer surface according to the present invention includes: an outer container 10 for airtightly isolating the inside from the outside; an inner tube 12 penetrating the outer container 10 and having an inlet 14 and an outlet 16 for gas and vapor; and a gas supply unit 38 for supplying $N_2$ gas, HF gas and $H_2O$ vapor to the inlet 14 of the inner tube 12.

An intermediate portion of the inner tube 12 has an opening within the outer container 10. In the opening, a first wafer heating chamber 18 and a second vapor heating chamber 20 are provided opposite to each other. The wafer heating chamber 18 has an inlet 22 and an outlet 24 for heated air. The second vapor heating chamber 20 also has an inlet 26 and an outlet 28 for heated air.

The vapor heating chamber 20 is closed airtight. An ultraviolet radiation lamp 30 and an end point sensor 32 are provided inside the vapor heating chamber 20.

A silicon wafer W to be cleaned is placed with the surface (the upper surface in the figure) to be cleaned directed to the passage in the inner tube 12, in an opening of the wafer heating chamber 18 facing the opening of the inner tube 12. The silicon wafer W isolates the inner tube 12 from the wafer heating chamber 18. A flow path of gas and vapor is formed by the inner tube 12, the silicon wafer W and a wall of the vapor heating chamber 20 opposite to the silicon wafer W.

The wafer heating chamber 18 is provided with a temperature controller 34 for maintaining the surface of the silicon wafer W at a desired temperature. The vapor heating chamber 20 is provided with a temperature controller 36 for maintaining the vapor in the inner tube 12 at a prescribed level.

Figure 2:
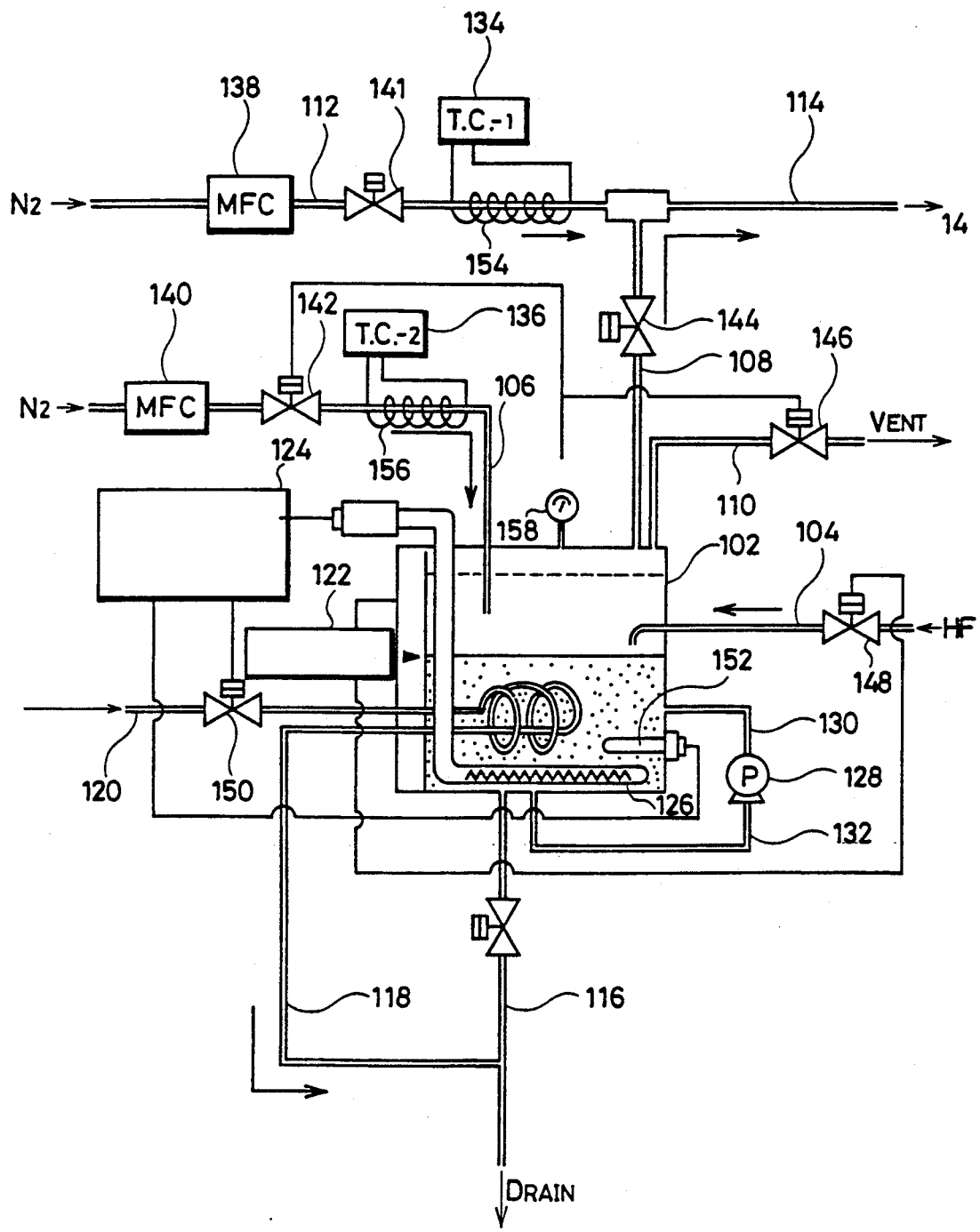
FIG. 2 is a schematic view of a unit for supplying HF gas, water vapor, $N_2$ gas and the like to a chamber.

Referring to FIG. 2, the gas supply unit 38 includes a hydrofluoric acid tank 102 for storing hydrofluoric acid to be used for treatment. To the hydrofluoric acid tank 102 are connected the flow lines 104 and 106. An opening communicating with a flow line 116 for drain is provided in the bottom surface of the hydrofluoric acid tank 102. A pump 128 is connected to the hydrofluoric acid tank 102 through flow lines 130 and 132. The pump 128 is used to agitate the hydrofluoric acid in the hydrofluoric acid tank 102.

A temperature sensor 152, a heater 126 and a flow line 120 which are provided in the hydrofluoric acid tank 102 are connected to a temperature controller 124.

The flow line 120 serves to pass cold water, has a helical form in the hydrofluoric acid tank 102, and is further connected to the flow line 116 through a flow line 118.

The hydrofluoric acid tank 102 further includes a level controller 122 which is used to regulate the level of hydrofluoric acid in the hydrofluoric acid tank 102.

The hydrofluoric acid tank 102 further includes a pressure gauge 158 is used to control a valve 142 provided in the flow line 106, and a valve 146 provided in the flow line 110 for draining therethrough fluid from the hydrofluoric acid tank 102, thereby controlling the pressure in the hydrofluoric tank 102.

The temperature controller 124 responds to the temperature of hydrofluoric acid as detected by the temperature sensor 152 to regulate the temperature of the hydrofluoric acid in the tank 102 by controlling the valve 150 of the flow line 120 and the heater 126.

The flow line 106 includes a mass flow controller 140, a heater 156, and a temperature controller 136 for controlling the heater 156. $N_2$ gas is supplied to the flow line 106 from a gas source, not shown.

The gas supply unit 38 further includes a flow line 112 through which the $N_2$ gas from non-illustrated gas source passes. The flow line 108 from the tank 102 joins the flow line 112, thereby forming a flow line 114 communicating with the inlet 14. The flow line 112 includes a mass flow controller 138, a valve 141, a heater 154, and a temperature controller 134 for controlling the heater 154. The flow line 108 has a valve 144. By regulation of the valves 141, 144, $N_2$ gas supplied by the flow line 112 or hydrofluoric acid vapor supplied from the tank 102 is selectively supplied to the inlet 14 of the inner tube 12.

Referring again to FIG. 1, the end point sensor 32 is used to detect an end point of treatment. Normally, the end point sensor 32 includes a light emitting fiber and a light receiving fiber, not shown.

The light emitting fiber is used to apply a coherent beam to the surface of the silicon wafer W. The beam is reflected off the upper surface of a film of the silicon wafer W and off the lower surface thereof. The reflected beams are received by the light receiving fiber. The two reflected beams interfere with each other due to the optical path difference thereof. Since the optical path difference is equal to twice the thickness of the film, it is possible to know a proceeding stage of the treatment by examining the intensity of the reflected beams. Normally, the reflected beams are converted to voltage by a photodiode or the like and a change in the intensity level is examined, whereby the end point of the treatment is detected.

In order to remove a native oxide film located on the silicon wafer with the above-described apparatus, first, the silicon wafer W is fed into the outer container 10 and is set in a prescribed position as shown in FIG. 1. The feeding of the wafer W is effected by a mechanical conveyer or the like capable of holding the wafer W by vacuum contact or the like. The ultraviolet radiation lamp 30 emits ultraviolet radiation onto the surface of the silicon wafer W. Oxygen excited by the ultraviolet radiation decomposes and removes impure organic materials adhering to the surface of the silicon wafer W.

Those features attained by radiation with ultraviolet beams of disclosed, for example, in Japanese Patent Laid-Open Patent No. 63-33824.

$N_2$ gas is introduced through the inlet 14 into the inner tube 12 so that the inner tube 12 is purged by $N_2$ gas. The introduction of $N_2$ gas into the inner tube 12 is effected by opening the valve 141 and closing the valve 144 shown in FIG. 2. $N_2$ gas is mentioned by way of example, since any gas may be used so long as it is inert to the silicon layer surface to be treated and the inner walls of the chamber.

While the inner tube 12 is being purged by $N_2$ gas, heated air is introduced into the wafer heating chamber 18 through the inlet 22. As a result, the silicon wafer W is heated. The surface temperature $T_s$ of the silicon wafer W is regulated by the temperature controller 34 so that it exceeds by 20° C. or more the temperature $T_v$ of hydrofluoric acid vapor introduced later into the inner tube 12. Thus, a relation of $T_s - T_v \geq 20°$ C. holds. The temperature controller 34 measures the surface temperature of the wafer W and regulates the temperature of the heated air supplied to the wafer heating chamber 18 through the inlet 22 based on the measured value.

Referring to FIG. 2, when the valve 141 is closed and the valve 144 is opened, hydrofluoric acid ($HF/H_2O$) vapor is introduced into the inner tube 12 through the inlet 14 in place of $N_2$ gas. The temperature controller 36 measures the temperature of the vapor supplied to the vapor heating chamber 20 through the inlet 26. The temperature controller 36 regulates the temperature of heated air based on the measured value. Thus, the hydrofluoric acid vapor introduced into the inner tube 12 maintains the temperature at a prescribed level with the temperature controller 36.

The hydrofluoric acid vapor is introduced into the inner tube 12. The surface of the silicon wafer W is exposed to the hydrofluoric acid vapor. As a result, the native oxide film formed on the silicon wafer W is etched and removed from the surface of the silicon wafer W. At this time, the surface temperature of the silicon wafer W is maintained higher than the temperature of the hydrofluoric acid vapor by 20° C. or more. Thus, condensation of the hydrofluoric acid vapor onto the surface of the silicon wafer W is suppressed. Etching of the thermal silicon dioxide film, CVD silicon dioxide film and the like formed on the silicon wafer W hardly proceeds.

After the native oxide film has been removed from the surface of the silicon wafer W, the flow lines are switched and $N_2$ gas is introduced again into the inner tube 12. Thus the inner tube 12 is purged by $N_2$ gas. The completion of the removal of the native oxide film is detected by monitoring an output of the end point sensor 32 as was described previously.

While the inner tube 12 is being purged by $N_2$ gas, ultraviolet rays (of wavelengths 184.9 nm, 253.7 nm) are applied from the ultraviolet radiation lamp 30 to the surface of the silicon wafer W. In consequence, remaining fluorine (F) is removed from the surface of the wafer W. After the inner tube 12 is further purged by $N_2$ gas for a prescribed period, the silicon wafer W is taken out from the outer container 10 by a carrying mechanism (not shown).

In the apparatus shown in FIG. 1, the vapor heating chamber 20 containing the ultraviolet radiation lamp 30 and the end point sensor 32 needs to have a transparent portion facing inside of the inner tube 12. Therefore, a partition wall of this portion is formed of quartz glass. Usually, quartz glass is corroded by hydrofluoric acid vapor. In order to prevent the corrosion, it is merely necessary to keep the surface temperature of the partition wall of quartz glass higher than the temperature of hydrofluoric acid vapor by 20° C. or more.

The vapor supplied through the vapor inlet 14 may be mixture of hydrogen fluoride gas and water vapor. Any gas mixture may be employed so long as it contains hydrogen fluoride and water.

The experiments described below were carried out by using an experimental apparatus having the same fundamental structure as that of the above-described apparatus.

Figure 3:
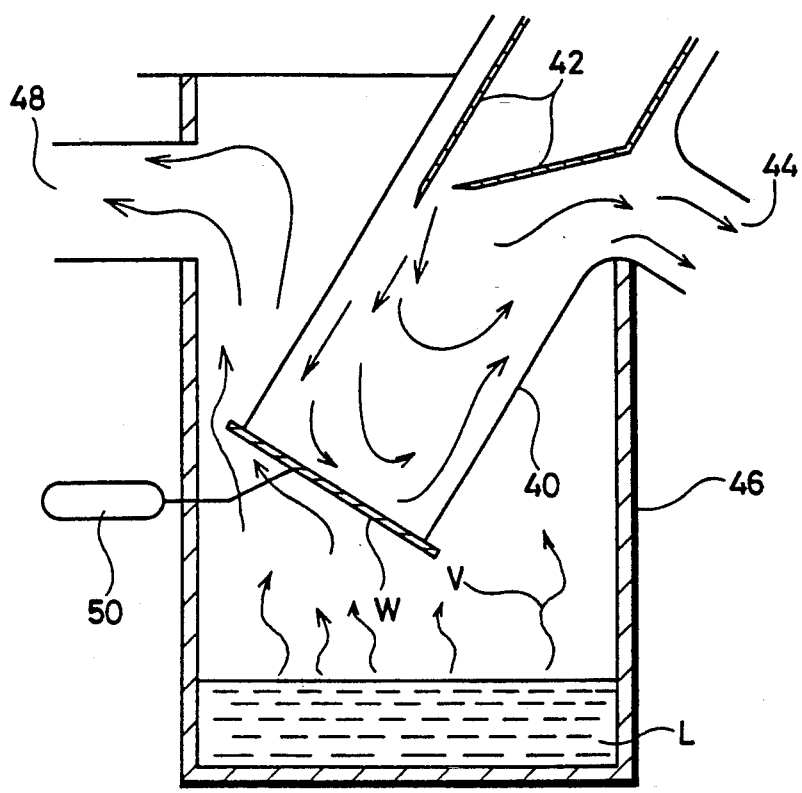
FIG. 3 is a schematic view of an apparatus used in an experiment performed in connection with the present invention.

Referring to FIG. 3, the apparatus used in the experiments included: a wafer heating cylinder 40 with a heater 42, an outlet 44 and an opening formed at its top end; and a container 46 containing hydrofluoric acid L and having an outlet 48. A wafer W is shown in FIG. 3 attached to the opening of the top end of the cylinder 40. A detection tip of a temperature sensor 50 is in contact with the surface of the wafer W. The top end of the wafer heating cylinder 40 is inserted obliquely in the container 46 and the cylinder 40 is positioned in the container 46 in an airtight manner.

This apparatus was placed in a draft chamber (not shown). The draft chamber served as a local evacuating chamber that was used at the time of performing a dangerous chemical experiment or the like. An operator outside the draft chamber controls the operation of the apparatus in the draft chamber. For that purpose, an opening for the work is provided in the front surface of the draft chamber. Air in the draft chamber is forced to flow out from an outlet provided in the ceiling of the draft chamber. The draft chamber is evacuated, whereby vapor V in the container 46 is discharged through the outlet 48.

The wafer W was kept inclined in the container 46. Since the wafer W was thus held, the flow of the vapor V in the container 46 was not obstructed. The vapor contacted uniformly the surface of the wafer W. As a result, the whole surface of the wafer W was uniformly treated.

The draft chamber was maintained at room temperature (22° C.). The temperatures of hydrofluoric acid L and fluorine vapor V in the container 46 were also maintained at the room temperature. By regulating the blowing quantity of air heated by the heater 42 based on the result of detection of the temperature sensor 59, the surface temperature of the wafer W was regulated. Aqueous solution containing hydrogen fluoride of 50% was used as the hydrofluoric acid L. The concentration of the hydrogen fluoride in the hydrofluoric acid vapor V was 1.5 wt %. The container 46 was under atmospheric pressure.

In the first experiment, silicon wafers of 6 inches in diameter (of P type (100)), on each of which a thermal silicon dioxide film of about 5,000 Å in thickness was formed, were prepared as specimens. Etching was effected by using the above-mentioned apparatus in both the case where the surface temperature of the wafer W was maintained at the room temperature (22° C.) and the case where it was maintained at 65° C. The results were evaluated by measuring and comparing the etching rates.

Measuring points were common to each wafer. More specifically, the etching rate was measured at 27 points spaced 5 mm apart along a specified direction of each wafer. An average of the measured values was obtained to express the etching rate. An optical interference type film thickness measuring apparatus using a microscopic spectral analyzer was used for measurement of film thickness. The measurement accuracy of this film thickness measuring apparatus was ±10 Å.

The results of the measurement are as follows. When the surface temperature of the wafer W was maintained at 22° C., the etching rate of the thermal silicon dioxide film was 1,323 Å/min. On the other hand, when the surface temperature of the wafer W was maintained at 65° C., the thermal silicon dioxide film was hardly etched. The etching rate in this case was 0.68 Å/min.

In the case of maintaining the surface temperature of the wafer W at 65° C., an experiment was performed to determine whether the native oxide film was etched. Silicon wafers of 6 inches in diameter (of P type (100)) were used as specimens in the above-mentioned experiment. An ellipsometer (a film thickness measuring apparatus based on ellipsometry) was used for measurement of film thickness.

The results are as follows. The thickness of the native oxide film before treatment was 14.7 Å, while the thickness after the treatment was 5.0 Å. Consequently, it can be confirmed that the native oxide film was etched and removed almost entirely from the silicon wafer.

Although the above-mentioned results could be easily understood by those having ordinary skill in the art, a further explanation is provided below to facilitate the thereof.

A measured value by an ellipsometer is assumed to be $X_1$. A measured value by X-ray electron spectroscopy for chemical analysis (ESCA) is assumed to be $X_2$. The following relation is established between $X_1$ and $X_2$.

$$X_1 - X_2 \approx 3.5 \text{ to } 5.0 \text{ Å}$$

As can be seen from this relation, the measured value of 5.0 Å by the ellipsometer means that such thickness cannot be detected within measurement by ESCA. Consequently, from the results of the above-mentioned experiments, the wafer is considered to have a surface with very little native oxide film.

From the results of the above-mentioned two experiments, it was confirmed that by regulation of the surface temperature of a silicon wafer, only the native oxide film can be selectively removed from the silicon wafer with a thermal silicon dioxide film remaining on the silicon wafer.

Further, an experiment as described below was performed. In this experiment, the change in etching rate was examined by varying the surface temperatures of silicon wafers.

Silicon wafers of 6 inches in diameter (of P type (100)), on each of which a thermal silicon dioxide film of about 5,000 Å in thickness was formed, were used as specimens. The treatment time was selected to be 60 seconds in all cases. Measuring points located were 27 points at intervals of 5 mm along a specified direction of each wafer. Evaluation of etching rates was made by an average value of etching rates measured at the respective measuring points. Film thicknesses before and after treatment are measured by using the abovementioned optical interference type film thickness measuring apparatus. The measurement accuracy was ±10 Å. The temperatures were set to 23° C., 35° C., 37.5° C., 45° C. and 65° C. The accuracy of temperature regulation was in the range of about ±1° C.

Figure 4:
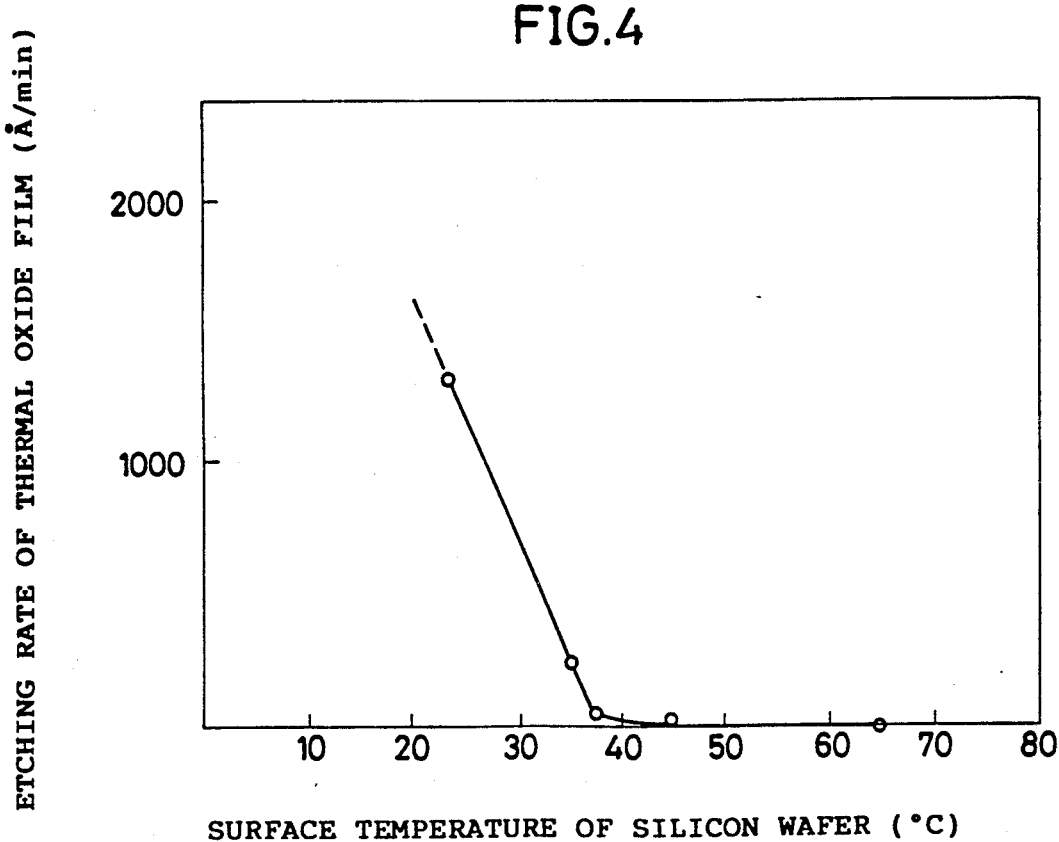
FIG. 4 is a graph showing a relationship between a surface temperature of a silicon wafer and an etching rate of a thermal oxide film.

FIG. 4 shows the results of the experiment. Referring to FIG. 4, based on the increase of the surface temperature of the silicon wafer, the etching rate of the thermal silicon dioxide film reduced, the etching stopping at 65° C. A boundary temperature at which etching of the thermal oxide film hardly occurs is about 37.5° C.

From this result, it is concluded that by regulating the surface temperature of a silicon wafer, it is possible to suppress etching of a thermal silicon dioxide film. In addition, it is confirmed that it is possible to stop etching reaction of a thermal silicon dioxide film on a silicon wafer by making the surface temperature of the silicon wafer W higher than the temperature (normal temperature) of hydrofluoric acid vapor V by about 15° C. or more.

In the foregoing, the present invention has been described in connection with one embodiment which is related to the application of the present invention for selectively removing a native silicon oxide film from a silicon wafer. However, the present invention is not limited thereto.

For example, the native silicon oxide film to be selectively removed may be a native silicon oxide film formed on a surface of a polysilicon film or on a surface of an amorphous silicon film. The polysilicon film or amorphous silicon film is not limited to a film formed on a silicon wafer. Such a film may be formed on various semiconductor wafers such as gallium arsenic wafers.

In addition, the wafer may be a gallium arsenic wafer or the like.

The film to be left in selectively removing the native oxide film is not limited to a thermal silicon dioxide film. The present invention is also applicable to other silicon oxide films (formed, for example, by a CVD method), other than the native oxidization, such as to a silicon nitride film.

Figure 5:
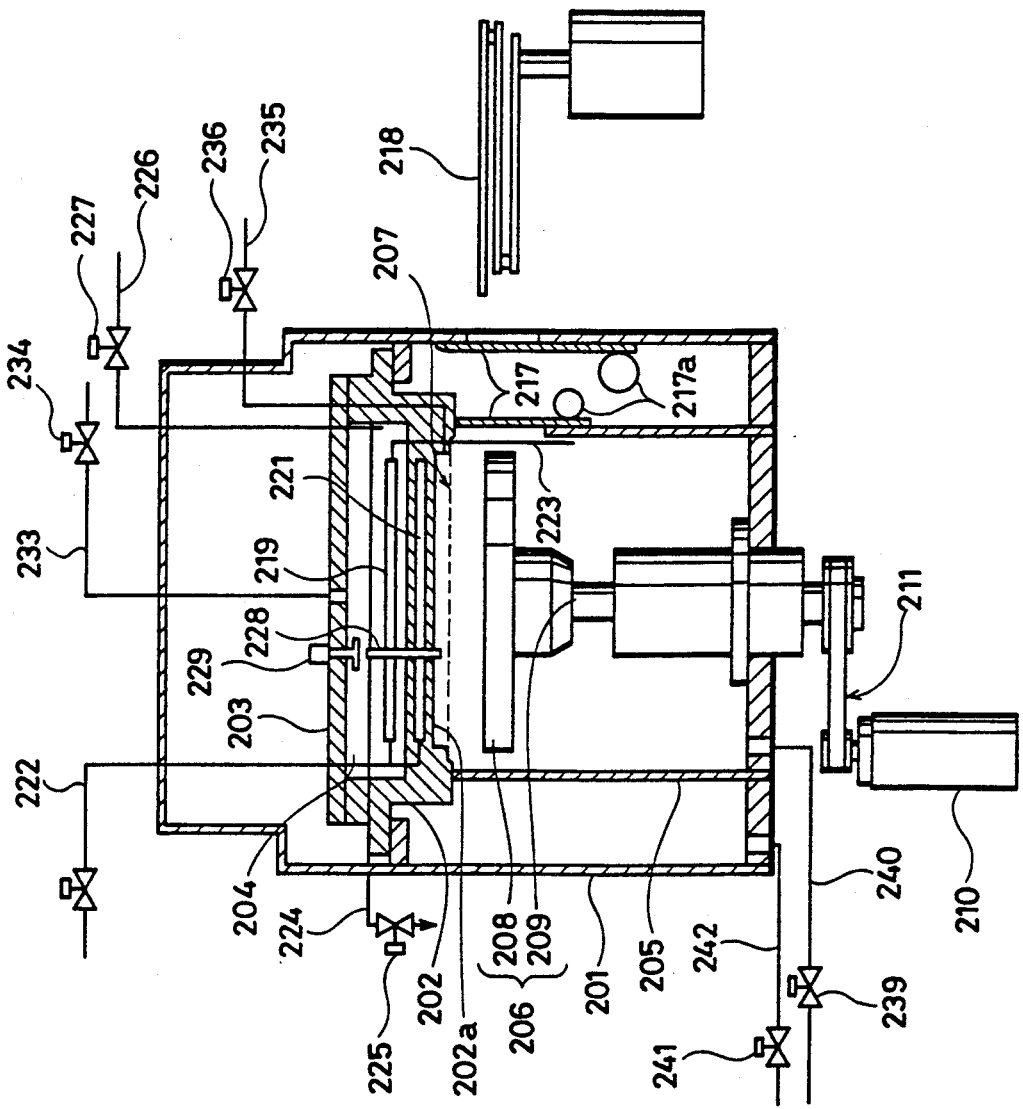

FIGS. 5 and 6 are schematic vertical sections illustrating an apparatus for use in practicing the invention, which are detailed in U.S. patent application Ser. No. 07/518,971, filed on May 4, 1990.

The apparatus shown in FIG. 5 is an improvement on the apparatus described in the preceding embodiments. A housing 201 contains a hydrofluoric acid tank 202 for storing hydrofluoric acid acting as a cleaning solution. The hydrofluoric acid tank 202 is closed by a top cover 203, and includes a vapor generating region 204 in an upper space thereof in which vapor is generated from hydrofluoric acid.

An inner housing 205 is provided inside the housing 201 and immediately under a bottom wall 202a of the hydrofluoric acid tank 202. The inner housing 205 accommodates a wafer supporting device 206 for supporting wafer W under treatment. A vapor supply section 207 is provided between an undersurface of the bottom wall 202a and wafer W for supplying the vapor of hydrofluoric acid.

As shown in FIG. 6, which is an enlarged sectional view, the wafer supporting device 206 includes a hot plate 208 rotatable on a vertical axis and containing a heater (not shown), and a support shaft 209 rigidly connected to the hot plate 208. The support shaft 209 operatively connected to an electric motor 210 outside the housing 201 through a belt transmission 211.

A vacuum suction passage 212 extends to the hot plate 208 passes through the support shaft 209 for maintaining the wafer in position by vacuum suction. The heater contained in the hot plate 208 is controlled by a temperature controller (not shown) to maintain a surface temperature of the hot plate 208 equal to or above the atmospheric temperature in the vapor supply section 207.

At a level substantially corresponding to the top surface of the hot plate 208, the inner housing 205 and housing 201 define openings 205a and 201a for allowing passage of the wafer W, respectively. Shutters 217 are provided for opening and closing the openings 205a and 201a. A flexion arm type wafer transport mechanism 218 disposed outside the opening 201a of the housing 201 is extendible to a position above the hot plate 208 for transporting the wafer W into and out of the inner housing 205. More particularly, the wafer W is delivered suction-supported by the transport mechanism 218 through the openings 201a and 205a onto the hot plate 208. Thereafter the transport mechanism 218 is retracted outwardly of the housing 201, then the openings 201a dn 205a are closed by shutters 217 and the wafer W is sucked to the hot plate 208. For removing the wafer W outwardly of the housing 201, the above sequence is reversed. That is, the shutters 217 are opened and the wafer W is carried by the transport mechanism 218 outwardly of the housing 201 through the openings 205a and 201a.

Each shutter 217 is movable between opening and closing positions by means of a rack (not shown) and a pinion (not shown), the latter being driven by an electric motor 217a. The shutters 217 may have any desired construction as long as they enable wafer transport and formation of a gastight space.

As shown in FIG. 6, the hydrofluoric acid tank 202 includes hot water piping 219 supported by a holder or holders not shown. The bottom wall 202a of the tank 202 defines a hot water passage 221 therein. Hot water is circulated through a loop made up of a hot water supply pipe 222 in FIG. 5, the piping 219, passage 221 and a hot water exhaust pipe 223. The circulating hot water heats and evaporates hydrofluoric acid stored in the hydrofluoric acid tank 202. Thus, the hot water piping 219 and hot water passage 221 constitute heating means for heating and evaporating hydrofluoric acid. Reference mark S1 in FIG. 6 denotes a temperature sensor for measuring temperature of hydrofluoric acid in the hydrofluoric acid tank 202. The measured temperature is used to control the amount of hot water flowing through the piping 219 and passage 221, thereby maintaining the temperature of hydrofluoric acid below its boiling point.

When a cleaning solution having a low boiling point is employed, for example, the hot water piping 219 may be omitted, with the hot water passage 221 alone used to heat the cleaning solution. Further, oil may be used as a heating medium instead of hot water.

As shown in FIG. 5, the hydrofluoric acid tank 202 includes an overflow passage 224 having an automatic switch valve 224 mounted in an intermediate position thereof. Hydrofluoric acid having a concentration of 39.4% is supplied initially or is replenished from a storage tank (not shown) through a supply pipe 226 until it overflows the tank 202. When an overflow occurs, a valve 227 is closed so that an appropriate amount of hydrofluoric acid is stored in the tank 202. A temperature controlling device may be provided for the hydrofluoric acid supply pipe 226 since it is desirable to preheat hydrofluoric acid supplied therethrough to a predetermined temperature. After the appropriate amount of hydrofluoric acid is stored, the automatic switch valve 225 is closed to prevent the hydrofluoric acid vapor from leaking through the overflow passage 224 during treatment. The acid is replenished midway in the cleaning treatment, the replenishment timing being based on the number of wafers W processed and the processing time. The construction for supplying the appropriate amount of hydrofluoric acid into the hydrofluoric acid tank 202 may, for example, include a liquid level gauge in the tank 202 for detecting a fluid level reduction of a predetermined amount, on the basis of which an appropriate amount of hydrofluoric acid is then supplied.

A vapor supply passage 228 opens to communicate with the vapor generating region 204 at a position above an opening position of the overflow passage 224. An end of the vapor supply passage 224 opens through the bottom of the hydrofluoric acid tank 202 into the vapor supply section 207. A device 229 is provided for automatically opening and closing the vapor supply passage 228.

A carrier gas supply pipe 233 is connected to an upper position of the vapor generating region 204 for supplying nitrogen gas $N_2$ as a carrier gas. The carrier gas supply pipe 233 includes a valve 234. The carrier gas is used to feed, into the vapor supply passage 228, the hydrofluoric acid vapor collected in the vapor generating region 204 by heating.

A mixing gas supply pipe 235 is connected to the vapor supply section 207 for supplying nitrogen gas $N_2$ as a mixing gas. The mixing gas supply pipe 235 includes a valve 236.

Though not shown, each of the carrier gas supply pipe 233 and mixing gas supply pipe 235 has a temperature controlling device for maintaining nitrogen gas flowing therethrough to a predetermined temperature.

The vapor supply section 207 includes a vapor scattering porous plate 237 defining a vapor space 238 with the bottom wall 202a of the hydrofluoric acid tank 202. The vapor supply passage 228 communicates with the vapor space 238 for supplying the hydrofluoric acid vapor to the surface of wafer W on the hot plate 208. Hydrofluoric acid in the vapor supply section 207 is maintained at a temperature above its dew point by the heating action of the hot water passage 221 defined in the bottom wall 202a of hydrofluoric acid tank 202 and by the heat from the hot plate 208.

According to the described construction, the hydrofluoric acid tank 202, vapor generating region 204, vapor supply section 207, and vapor supply passage 228 intercommunicating the vapor generating region 204 and vapor supply section 207 are arranged vertically close to one another. These components may, therefore, be heated or temperature-controlled efficiently and together in a manner that, readily prevents condensation of the cleaning vapor flowing therein.

As shown in FIG. 5, a first exhaust pipe 240 having a first flow control valve 239 communicates with the interior space of inner housing 205. A second exhaust pipe 242 having a second flow control valve 241 communicates with the space defined between inner housing 205 and outer housing 201. The first and second exhaust 240 and 242 are connected to respective suction devices (not shown). The first flow control valve 239 has a larger opening degree than the second flow control valve 241, so that a greater amount of gas is exhausted from inside the inner housing 205 than from space between the two housings 201 and 205. This exhaust control arrangement is effective for preventing the hydrofluoric acid vapor exhausted after being supplied to the wafer W from leaking out of the apparatus.

In order to increase the displacement on inner housing 205 over that of outer housing 201, the exhaust pipe 240 may have a larger diameter than the exhaust pipe 242, with the two pipes 240 and 242 connected to the common suction device or separate suction devices.

The following experiments were conducted in the manner similar to that in the above experiments, utilizing the apparatus shown in FIGS. 5 and 6.

Aqueous solution containing hydrogen fluoride of 39.4% at the temperature of 20° C. under the azeotropic condition was used as the hydrofluoric acid L. The concentration of the hydrogen fluoride in the hydrofluoric acid vapor V was 0.48 wt % after being diluted by $N_2$ gas. The inner housing 205 was under atmospheric pressure.

As a sample, (a) a first silicon wafer of 5 inches in diameter (of p type (100)), on which was formed a thermal silicon dioxide film of about 5,000 Å in thickness, was used. Likewise, as further samples silicon wafers of (b) 6 inch diameters and having formed thereon a PSG film of about 4,000 Å, (c) 6 inch diameters and having formed thereon a BPSG film of about 5,000 Å, (d) 6 inch diameters and having formed thereon a native silicon oxide film of about 15 Å, (e) 5 inch diameters and having formed thereon a CVD silicon dioxide film (undoped CVD silicon dioxide film) of about 2,000 Å, and (f) 5 inch diameters and having formed thereon a silicon nitride (SiNx) film of 1,500 Å. Of the above films, the native silicon oxide film was prepared by immersing the wafer in the solution which contained: (a) an aqueous solution of 28% ammonia $NH_4$; (b) an aqueous solution of 30% hydrogen peroxide $H_2O_2$; and (c) water $H_2O$. The volume ratio of these three components (a) through (c) was 1:1:5. The SiNx film was $Si_3N_4$.

Each of these wafers was subjected to the etching treatment as the temperature thereof was gradually increased from 22° C., with the temperature of the hydrofluoric acid vapor being maintained at 22° C. The etching rate was measured at 29 points for the wafers (a), (b) and (c), and at 21 points for the wafers (d), (e) and (f). The measuring points were at equal intervals of 5 mm along a specified direction of the wafers except for the wafer (d), whose measuring points were at intervals in plural concentric lines. Evaluation of the etching rates was made by an average value of the etching rates measured at the respective measuring points. Further, the optical interference type film thickness measuring apparatus using a microscopic spectral analyzer was used for the film thickness measurements for the wafers (a), (b), (c) and (e) whereas the ellipsometer for the wafer (a), (d) and (f). Thus the relation was studied between the etching rates of the above insulating film and the temperature differences of the hydrofluoric acid vapor from the wafers.

Figure 7B:
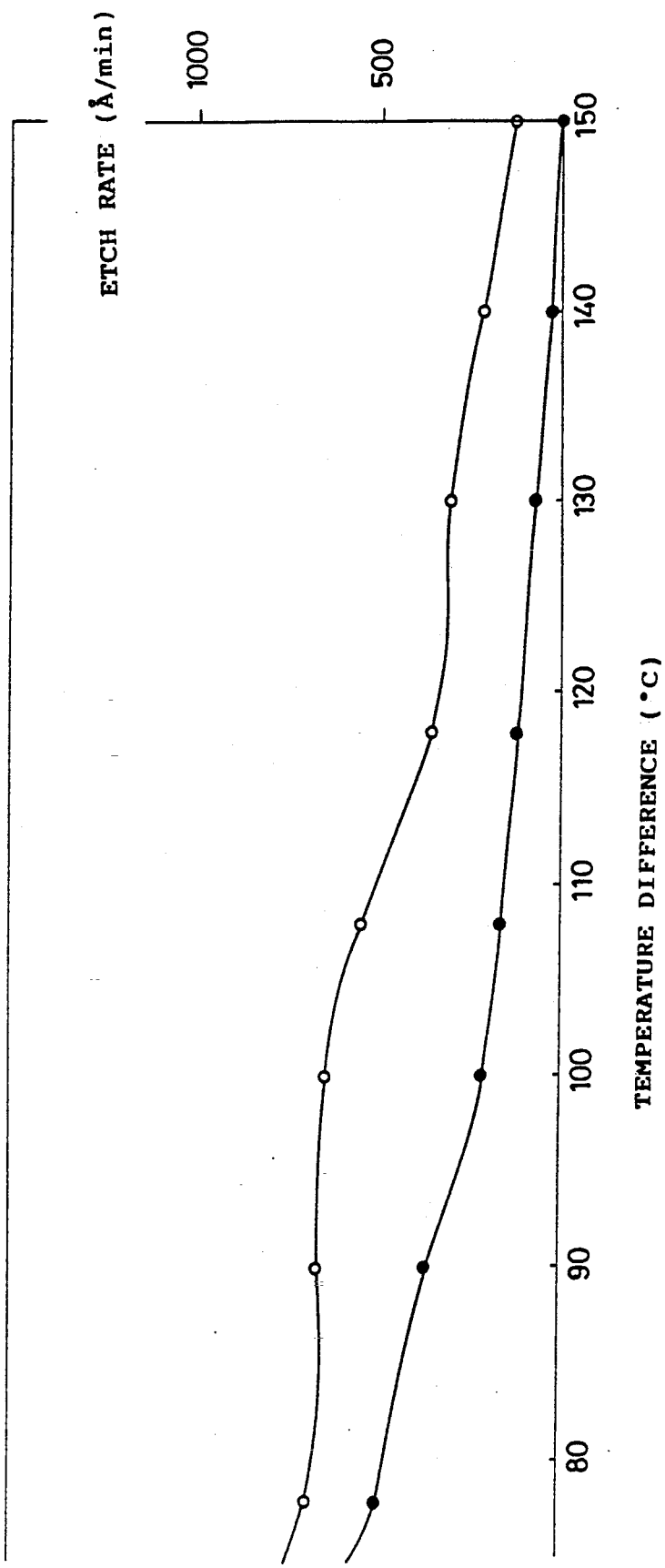
Figure 8:
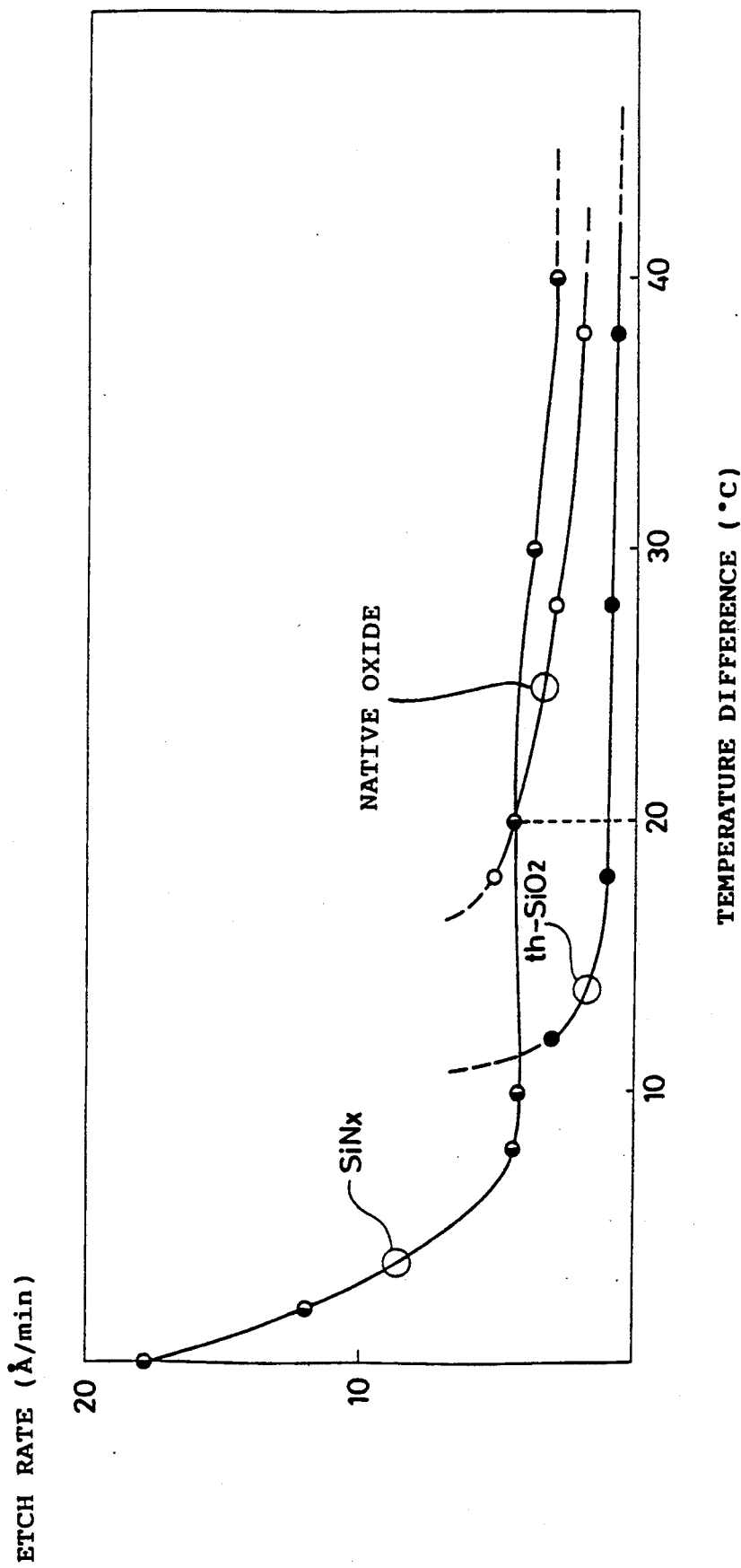

FIGS. 7A and 7B show the results of the above experiments using optical interference type film thickness measuring apparatus while FIG. 8 the results of the above experiments using ellipsometer. The abscissa denotes the temperature difference between the hydrofluoric acid vapor and the wafers, and the ordinate, the etching rate. From FIGS. 7A and 7B, it can be appreciated that each of the etching amounts of the thermal silicon dioxide film, PSG film, and BPSG film changes over time. There is a general tendency for the etching rates of these films to be lower as the temperature difference becomes large. It appears that the etching of the thermal silicon dioxide film does not occur at the temperature difference of about 12° C. The PSG film and BPSG film exhibit similar curves and continue to be etched until a temperature difference of more than 150° C. is reached. Thus, it should be appreciated that the etching rate largely depends on the quality and type of the insulating film formed on the wafer. The minimal etching selectivity of the PSG and BPSG films from the thermal silicon dioxide film falls within the temperature difference range from 2° C. to 8° C., the maximal etching selectivity thereof being within the temperature difference range of 14° C. to 18° C. Consequently, it is possible to selectively remove the PSG and PBSG films with respect to the silicon thermal oxide film at the temperature difference of 12° C. and more. Particularly, it is possible to selectively remove the same within the range of the temperature difference from 14° C. to 18° C. at a rapid rate.

From FIGS. 7A and 7B, it can be further appreciated that the curves for by the PSG and BPSG films are shifted relative to each other. This implies that such a shifting phenomenon results from the difference in the doping amounts of phosphor P and boron B. The phenomenon takes place although the temperature difference becomes larger and continues to occur until the etching of the films stops. The etching of the BPSG film ceases after the temperature difference of 150° C. is reached. Thereafter it is possible to selectively etch the PSG film with regard to the former film at the maximum etching rate.

In the above experiment, the removal of the PSG, BPSG doped oxide films proceeds in the following manner. When hydrofluoric acid vapor is supplied to the silicon layer surface, the hydrofluoric acid vapor is adsorbed on the silicon layer surface. The PSG, BPSG, etc. doped films formed on the silicon layer surface are etched by a reaction represented by the following chemical formula, in the presence of $H_2O$.

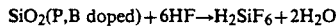

$$SiO_2(P,B\ doped) + 6HF \rightarrow H_2SiF_6 + 2H_2O$$

By the above-indicated reaction, fluorosilisic acid ($H_2SiF_6$) is formed. $H_2SiF_6$ is present with a high concentration in a liquid film covering the surface of the native silicon oxide film. However, $H_2SiF_6$ is soon evaporated and removed from the silicon layer surface.

In the method according to the present invention, the temperature of the silicon layer surface is kept higher than the temperature of the hydrofluoric acid vapor by 15° C. or more. When the hydrofluoric acid vapor is supplied to the silicon layer surface, adsorption of the hydrofluoric acid vapor onto the silicon layer surface is suppressed.

In this situation, in the etching of the PSG, BPSG, etc. oxide films formed on the silicon layer surface, the reaction indicated in the above-mentioned chemical formula is not hindered as much from proceeding. However, the etching reaction of the thermal silicon dioxide film is almost entirely stopped.

The reasons for those differences in the reactions of the PSG, BPSG oxide films and thermal silicon dioxide film are not made clear at present. One possible explanation is a difference in qualities of those films. Another possible explanation is a difference in water contents of the films. A further possible explanation is influence of phosphor, boron doped in the oxide film.

The etching of the thermal silicon dioxide film was considered to stop at the temperature difference of more than about 12° C. based on the measurement using the optical interference type film thickness measuring apparatus. As shown in FIG. 8, however, it should be appreciated that the etching proceeds somewhat beyond the temperature difference of 12° C. and more based on the measurement utilizing the ellipsometer. The values of the etching rates of the silicon thermal oxide film are 3 Å/min at the temperature difference 12° C., 1 Å/min at 18° C. and more, and 0.8 Å/min at 38° C., respectively. Thus, more accurate data was obtained using the apparatus shown in FIGS. 5 and 6 than using the apparatus shown in FIG. 3. The etching rate of the silicon thermal oxide film gradually decreases as the temperature difference increases. The silicon nitride $SiN_x$ film and native oxide film also exhibit such tendency. However, the etching rate of the $SiN_x$ film is greater than that of the native oxide film and silicon thermal oxide film. The etching rate of the native oxide film is larger than those of the thermal oxide film. It appears that the curve of the native oxide film is shifted from the one of the thermal silicon dioxide film toward the right side (greater temperature side) in FIG. 8.

From the results of the experiments utilizing the apparatus shown in FIGS. 5 and 6 and through the analysis of the data shown in FIGS. 7A, 7B and 8, and further by the estimations made of the etching selectivity represented by the data, the following conclusions can be reached:

The control of the adsorption amount of the hydrofluoric acid vapor on the wafer enables the high removing selectivity below, raising the temperature of the wafer surface from that of the subject vapor (a) It is possible to selectively remove the native oxide film with respect to the thermal silicon dioxide film within range of the temperature difference of the wafer surface from the hydrofluoric acid vapor from 10° C. to 50° C., preferably being from 12° C. to 40° C. The preferable temperature difference range somewhat varies depending on the forming conditions of the native oxide film and the silicon thermal oxide film.

(b) It is possible to selectively remove the undoped CVD silicon dioxide film with respect to the thermal silicon dioxide film within a range of temperature difference of 10° C. to 30° C., preferably 12° C. to 18° C. The above preferable range varies to some extent depending on the forming condition of the CVD silicon dioxide film.

(c) It is possible to selectively remove the PSG film with regard to the thermal silicon dioxide film within a range of temperature difference of 10° C. to 200° C.

(d) It is possible to selectively remove the BPSG film with respect to the thermal silicon dioxide film within a range of temperature difference of 10° C. to 150° C.

(e) It is possible to selectively remove the PSG film with regard to the undoped CVD silicon dioxide film within a range of temperature difference of 150° C. to 200° C. m (f) It is possible to selectively remove the BPSG film with respect to the undoped CVD silicon dioxide film within a range of temperature difference of 15° C. to 150° C. The above range varies depending on the concentration of the phosphor and boron doped.

(g) It is possible to selectively remove the undoped CVD silicon dioxide film with regard to native silicon oxide film within a range of temperature difference of 12° C. to 30° C. The best range of the temperature difference varies depending on the type of the CVD method etc to be adopted.

(h) It is possible to selectively remove the PSG film with respect to the native silicon oxide film within a range of temperature difference of 12° C. to 200° C.

(i) It is possible to selectively remove the BPSG film with respect to the native silicon oxide film within a range of temperature difference of 12° C. to 150° C.

(j) It is possible to selectively remove the PSG film with respect to the BPSG film at the temperature difference of for example, 150° C. or more.

(k) It is possible to selectively remove thermal silicon dioxide film with regard to $SiN_x$ film within a range of temperature difference of 5° C. to 12° C.

(l) It is possible to selectively remove the $SiN_x$ film with respect to the thermal silicon dioxide film within a range of temperature difference of 12° C. to 100° C.

(m) It is possible to selectively remove the native silicon oxide film with respect to the $SiN_x$ film within a range of temperature difference of 5° C. to 20° C.

(n) It is possible to selectively remove the $SiN_x$ film with respect to the native silicon oxide film within a range of temperature difference of 20° C. to 150° C.

(o) It is possible to selectively remove the undoped CVD silicon oxide film with respect to the $SiN_x$ film within a range of temperature difference of 5° C. to 15° C.

(p) It is possible to selectively remove the BPSG film with regard to a $SiN_x$ within the range of temperature difference of 5° C. to 150° C.

(q) It is possible to selectively remove the PSG film with respect to the $SiN_x$ film within a range of temperature difference of 5° C. to 200° C.

According to the present invention, the film to be selectively removed are superposed on the film to be left, or horizontally separately formed on the wafer.

In selectively removing the desired insulating film, the concentration of the hydrogen fluoride in the hydrofluoric acid vapor can be set within a wide range of from 100% (anhydrous hydrogen fluoride gas) to 1% or less (diluted by $N_2$ gas). Particularly, it is possible to more stably control the selective removal by applying the anhydrous hydrogen fluoride gas or the azeotropic hydrofluoric acid vapor.

As described in the foregoing, according to the present invention, it is not necessary to considerably decrease the water content in a reaction system or to control the density of hydrogen fluoride gas. It is merely necessary to control the temperature of a silicon wafer and the temperature of supplied gas. Consequently, the apparatus used for carrying at the invention is simple and easy to control the reaction therewith. Thus, the present invention provides a new method of selectively removing an insulating film such as a native silicon oxide film and also a method of forming contact-holes prior to metallization in the MOS-IC manufacturing process, which can be applied relatively simply and easily.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A method for selectively removing a first insulating film with respect to a second insulating film from a wafer surface, said method comprising the steps of:

(a) preparing vapor containing hydrogen fluoride and water;

(b) maintaining a temperature of said wafer surface higher than a temperature of said vapor by a prescribed temperature difference range, said prescribed temperature difference range being determined by reference to characteristics of said first insulating film and said second insulating film, so that said first insulating film is capable of being selectively etched and removed with respect to said second insulating film by said hydrogen fluoride; and (c) applying said vapor to said wafer surface, whereby said first insulating film is selectively etched and removed with respect to said second insulating film by said hydrogen fluoride.

2. The method in accordance with claim 1, wherein said first insulating film and second insulating film are respectively comprised of native silicon oxide film and thermal silicon dioxide film, and said prescribed temperature difference range is from approximately 10° C. to approximately 50° C.

3. The method in accordance with claim 1, wherein said first insulating film and said second insulating film are respectively comprised of CVD silicon dioxide film and thermal silicon dioxide film, and said prescribed temperature difference range is from approximately 10° C to approximately 30° C.

4. The method in accordance with claim 1, wherein said first insulating film and second insulating film are respectively comprised of PSG film and thermal silicon dioxide film, and said prescribed temperature difference range is from approximately 10° C. to approximately 200° C.

5. The method in accordance with claim 1, wherein said first insulating film and second insulating film are respectively comprised of BPSG film and thermal silicon dioxide film, and said prescribed temperature difference range is from approximately 10° C. to approximately 150° C.

6. The method in accordance with claim 1, wherein said first insulating film and second insulating film are respectively comprised of PSG film and CVD silicon dioxide film, and said prescribed temperature difference range is from approximately 15° C. to approximately 200° C.

7. The method in accordance with claim 1, wherein said first insulating film and second insulating film are respectively comprised of BPSG film and CVD silicon dioxide film, and said prescribed temperature difference range is from approximately 15° C. to approximately 150° C.

8. The method in accordance with claim 1, wherein said first insulating film and second insulating film are respectively comprised of CVD silicon dioxide film and native silicon oxide film, and said prescribed temperature difference range is from approximately 12° C. to approximately 30° C.

9. The method in accordance with claim 1, wherein said first insulating film and second insulating film are respectively comprised of PSG film and native silicon oxide film, and said prescribed temperature difference range is from approximately 12° C. to approximately 200° C.

10. The method in accordance with claim 1, wherein said first insulating film and second insulating film are respectively comprised of BPSG film and native silicon oxide film, and said prescribed temperature difference range is from approximately 12° C. to approximately 150° C.

11. The method in accordance with claim 1, wherein said first insulating film and second insulating film are respectively comprised of SiN$_x$ film and thermal silicon dioxide film, and said prescribed temperature difference range is from approximately 10° C. to approximately 100° C.

12. The method in accordance with claim 1, wherein said first insulating film and second insulating film are respectively comprised of PSG film and SiN$_x$ film, and said prescribed temperature difference range is from approximately 5° C. to approximately 200° C.

13. The method in accordance with claim 1, wherein said first insulating film and second insulating film are respectively comprised of BPSG film and SiN$_x$ film, and said prescribed temperature difference range is from approximately 5° C. to approximately 150° C.

14. The method in accordance with claim 1, wherein said step (b) includes the steps of
detecting the temperature of said vapor,
detecting the temperature of said wafer surface, and
changing the temperature of said vapor or the temperature of said wafer surface based on the detected temperature of said vapor and the detected temperature of said wafer surface to cause a temperature difference of said vapor and said wafer surface to be at least 15° C.

15. The method in accordance with claim 1, wherein said step (b) includes the steps of
maintaining the temperature of said vapor at a predetermined constant temperature,
detecting the temperature of said wafer surface, and
maintaining the temperature of said silicon layer surface at a level higher than said constant temperature by 15° C. or more, in response to the detection of the temperature of said wafer surface.

16. The method in accordance with claim 1, wherein said step (a) includes the steps of
preparing hydrogen fluoride gas,
preparing water vapor, and
mixing said hydrogen fluoride gas and said water vapor.

17. The method in accordance with claim 1, wherein said step (a) includes the steps of
preparing a hydrogen fluoride aqueous solution, and
heating and evaporating said hydrogen fluoride aqueous solution.

18. The method in accordance with claim 1, further comprising the step of
placing a wafer having said wafer surface in a chamber isolated from external air, and
said step (c) including the step of introducing said vapor into said chamber.

19. The method in accordance with claim 18, further comprising the step of
applying ultraviolet radiation to said wafer surface of said wafer placed in said chamber, whereby
organic impurities are removed from said wafer surface.

20. The method in accordance with claim 18, further comprising the step of
purging said chamber by a gas inert to at least said chamber and said surface of said wafer, prior to the introduction of said vapor into said chamber.

21. The method in accordance with claim 18, wherein a part of said chamber is formed by quartz glass, said method further comprising the step of
keeping a surface temperature of said quartz glass in said chamber higher than the temperature of said vapor by 20° C. or more.

22. The method in accordance with claim 18, further comprising the step of
purging said chamber by a gas inert to at least said chamber and said wafer after the introduction of said vapor into said chamber.

* * * * *